(12) United States Patent
Seifert et al.

(10) Patent No.: US 6,411,775 B1
(45) Date of Patent: Jun. 25, 2002

(54) CERAMIC FLASH TV EVAPORATOR

(75) Inventors: Martin Seifert, Durach; Hans-Werner Urbat, Kempten, both of (DE)

(73) Assignee: Wacker-Chemie GmbH, Munich (DE)

( * ) Notice: Subject to any disclaimer, the term of this patent is extended or adjusted under 35 U.S.C. 154(b) by 0 days.

(21) Appl. No.: 09/721,843

(22) Filed: Nov. 24, 2000

(30) Foreign Application Priority Data

Nov. 25, 1999 (DE) .......................... 199 56 811

(51) Int. Cl.$^7$ .................... C23C 14/00; C23C 16/00
(52) U.S. Cl. ..................... 392/389; 118/726
(58) Field of Search ................. 392/386, 389, 392/388; 118/727, 726; 432/262, 156

(56) References Cited

U.S. PATENT DOCUMENTS

| | | | |
|---|---|---|---|
| 4,089,643 A | | 5/1978 | Jerabek et al. |
| 5,239,612 A | * | 8/1993 | Morris ...................... 392/389 |
| 5,395,180 A | * | 3/1995 | Mariner ..................... 392/389 |
| 6,081,652 A | | 6/2000 | Seifert |
| 6,085,025 A | | 7/2000 | Seifert |

FOREIGN PATENT DOCUMENTS

| | | |
|---|---|---|
| DE | 880 529 | 6/1953 |
| DE | 1 207 179 | 12/1965 |
| DE | 1973814 | 2/1999 |
| DE | 197 35 814 | 2/1999 |
| EP | 0 962 546 | 12/1999 |
| GB | 1137560 | 12/1968 |

OTHER PUBLICATIONS

English Abstract corresponding to DE 1207179.
Patent Abstracts of Japan, vol. 012, No. 479 (C–552) Dec. 14, 1988 & JP 63192860 A.
English Abstract corresponding to DE 880 529.

* cited by examiner

*Primary Examiner*—Sang Paik
(74) *Attorney, Agent, or Firm*—Collard & Roe, P.C.

(57) ABSTRACT

The invention relates to a ceramic flash TV evaporator for the evaporation coating of picture tubes with aluminum, containing a cavity whose width tapers in cross section through the evaporator from the upper edge of the evaporator to the lower edge of the evaporator, which is defined by the fact that the transition of the side walls of the evaporator to the underside of the evaporator is elliptically rounded in cross section at least over part of the longitudinal axis of the evaporator.

5 Claims, 9 Drawing Sheets

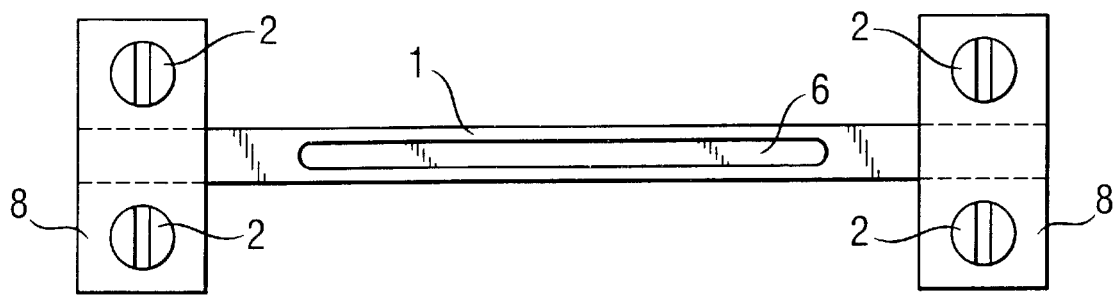
Fig. 1A Prior Art
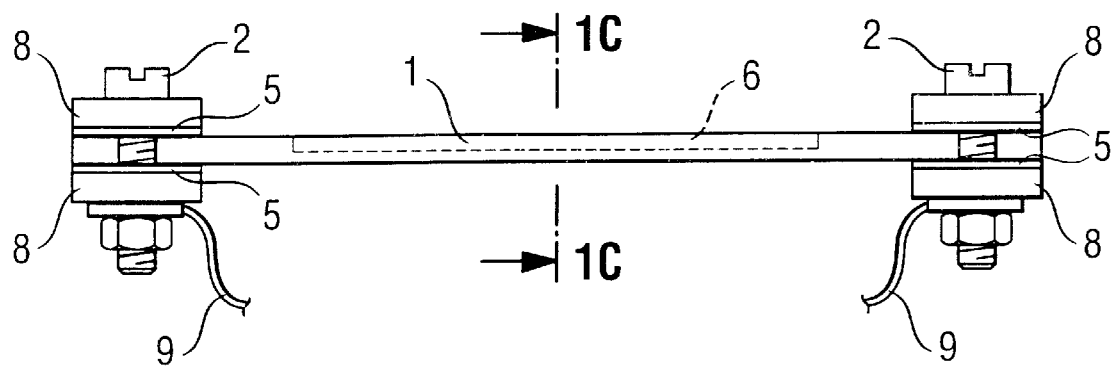
Fig. 1B Prior Art
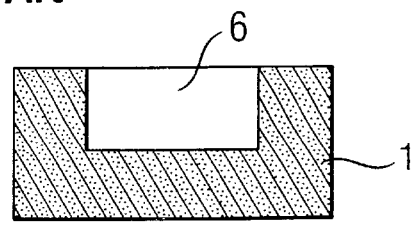
Fig. 1C (1C – 1C) Prior Art
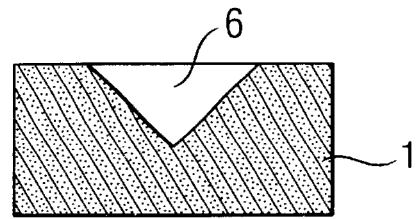
Fig. 1D Prior Art (6C - 6C)

(6D - 6D)

(6E - 6E)

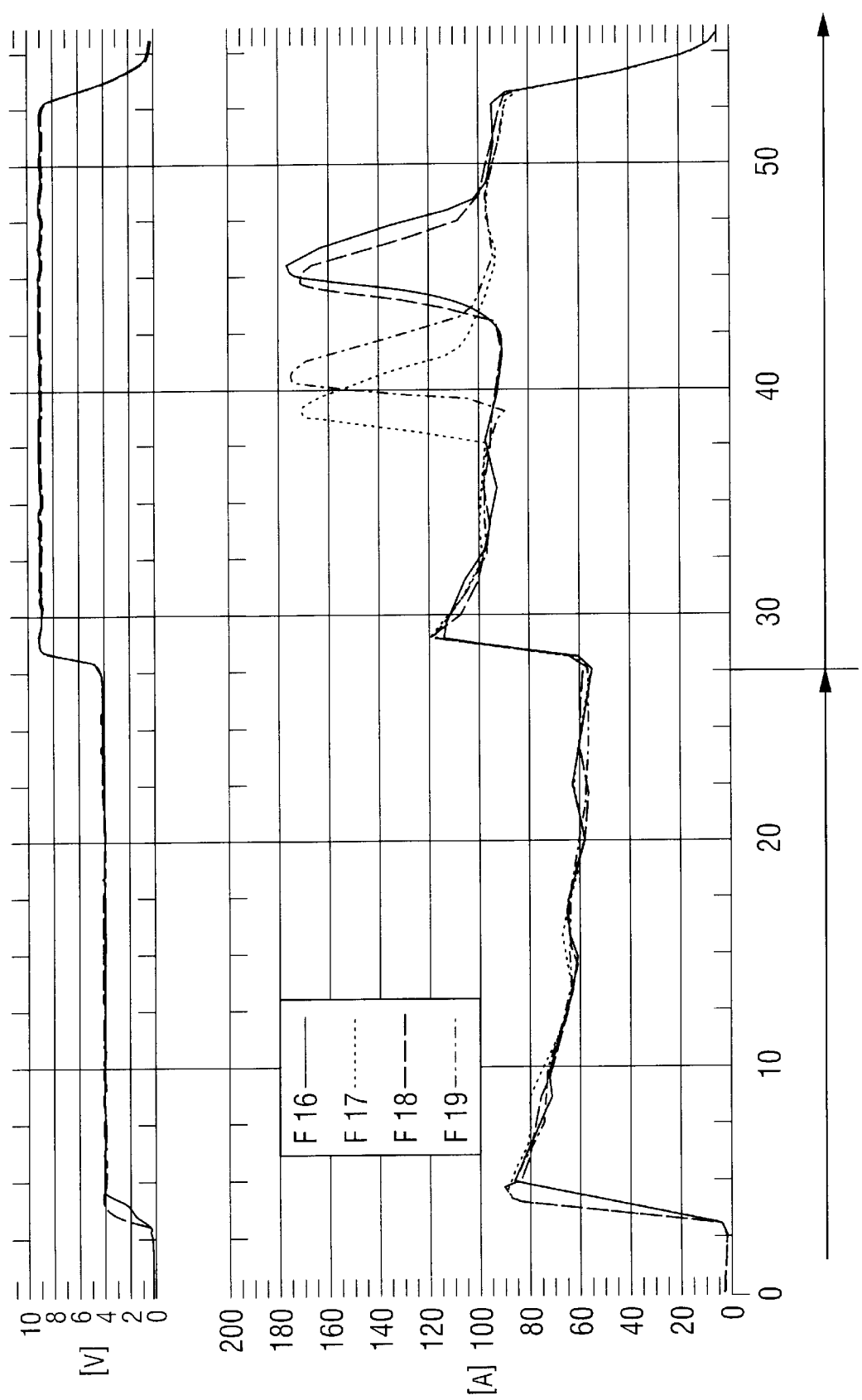

CERAMIC FLASH TV EVAPORATOR

FIELD OF THE INVENTION

The invention relates to a ceramic flash TV evaporator.

BACKGROUND OF THE INVENTION

Flash TV evaporators are used for the evaporation coating of monochrome or color picture tubes with aluminum, in order to produce an electrically conductive layer of a few 100 nm in the picture tubes. This layer constitutes the electrode for accelerating the electrons in the finished picture tube.

FIGS. 1 A/B show a conventional flash TV evaporator in its mounting. In the evaporation coating system, the flash TV evaporator (1) is clamped on both ends between two steel plates (8) with the aid of two screws (2). The steel plates (8) are connected to a current source via copper cables (9). To improve contact, there is generally a graphite sheet (5) between steel plate (8) and flash TV evaporator (1). The dimensions of a customary flash TV evaporator are 4.6.110 mm. It has a cavity (6; FIG. 1C) which is rectangular in the cross section of the flash TV evaporator. The cavity generally has a size of 2.4.40 or 60 mm. The width to which it is clamped laterally at each end is about 15 mm. The length of the flash TV evaporator to be heated is normally about 80 mm.

The picture tubes are evaporation-coated batchwise. A piece of aluminum (<100 mg), generally a cylindrical AL body, a so-called pellet, is placed into the cavity of the flash TV evaporator. The picture tube covering which is to be evaporation-coated is positioned over the flash TV evaporator. The space below the picture tube covering is then evacuated, so that the flash TV evaporator with the clamping system is contained in this vacuum ($10^{-5}$ mbar).

By a direct passage of current, the flash TV evaporator is heated in two voltage steps (preheating/evaporation FIG. 7, FIG. 8) and it evaporates the aluminum contained in its cavity in the process. The time required for this process is in the region of 40 sec to 2 min. The current densities involved briefly reach values of up to $10^3$ A/cm$^2$.

This heavy electrical and therefore thermal loading is what limits the service life, i.e. the number of heating cycles, of the flash TV evaporator.

The flash TV evaporator usually cracks in the region of the cavity after 500–900 heating cycles. It becomes broken and needs to be replaced.

DE 19735814 discloses a flash TV evaporator having an improved service life, improved evaporation behavior and improved wetting behavior which can nevertheless be used in conventional evaporator systems. This flash TV evaporator differs from the flash TV evaporators utilized until then by virtue of its triangular cavity. It is illustrated in cross section in FIG. 1 (D).

BRIEF DESCRIPTION OF THE INVENTION

The object of the present invention is to provide a flash TV evaporator for the evaporation coating of picture tubes with aluminum having further improved properties.

The object is achieved by means of a ceramic flash TV evaporator, containing a cavity whose width tapers in cross section through the evaporator from the upper edge of the evaporator to the lower edge of the evaporator, which is defined by the fact that the transition of the side walls of the evaporator to the underside of the evaporator is elliptically rounded in cross section at least over part of the longitudinal axis of the evaporator.

The flash TV evaporator according to the invention preferably has a cavity which is triangular in cross section through the flash TV evaporator. In this case, the two side faces of the triangular cavity can be straight (FIG. 2) or curved convexly (FIG. 3) or concavely (FIG. 4). The lowest point of the cavity may be designed as a radius (FIG. 5).

In the extreme case, this leads, when the side faces are convexly curved, to the cavity having a semicircular shape.

In the extreme case, this leads, when the side faces are concavely curved, to a narrow linear indentation in the longitudinal direction of the flash TV evaporator as the cavity.

The cavity preferably has a width of 2 mm to 5 mm at the top surface of the evaporator.

The lowest location of the cavity is preferably at least 1 mm and at most 3 mm below the upper edge of the evaporator.

The length of the cavity is preferably between 30 mm and 80 mm.

BRIEF DESCRIPTION OF THE DRAWINGS

FIGS. 1(A) to (B) illustrates a prior art flash TV evaporator. 1(A) is a plan view of a clamped TV evaporator, (B) is a side view of the clamped TV evaporator and (C) is a cross-sectional view of a TV evaporator with a rectangular cavity and (D) is a cross-sectional view of a TV evaporator with a triangular cavity.

FIG. 8 is an illustration of four flashes of a prior art TV evaporator showing the voltage profile and the current profile.

DETAILED DESCRIPTION OF THE INVENTION

Figure 2:
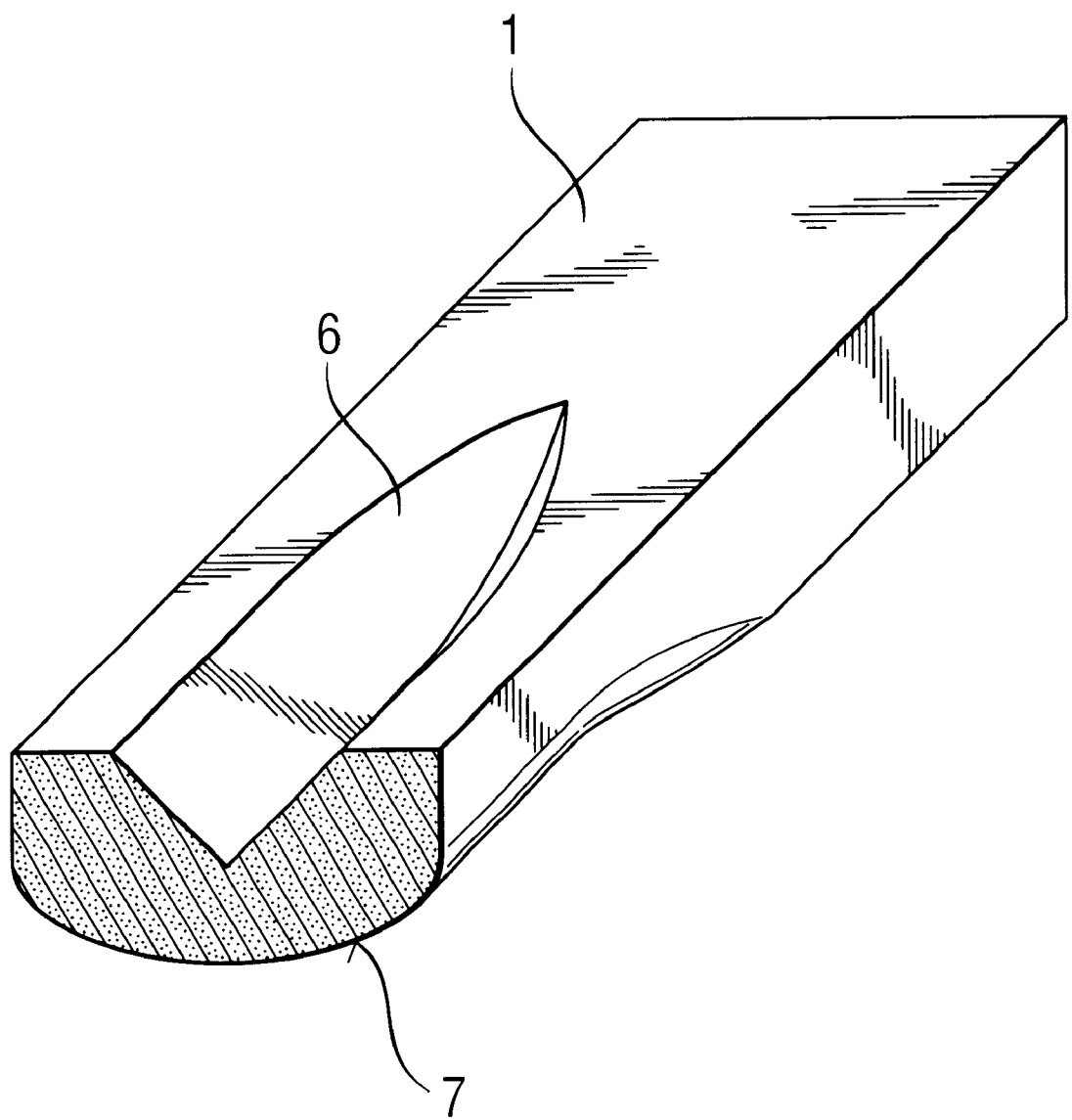
FIG. 2 is an isometric view of a flash TV evaporator of the invention.

In the text below, the term "underside" of the flash TV evaporator also includes the transition of the side region of the flash TV evaporator to the underside.

Preferably, the evaporator according to the invention has the form of a divided ellipse in cross section on the underside in the region of the cavity, while it has an underside of rectangular shape in cross section in the region of the ends of the evaporator.

The form of the divided ellipse is preferably as if the division of the ellipse had been effected along its major axis.

Preferably, the elliptic rounding of the underside of the flash TV evaporator does not begin directly on the upper edge of the evaporator.

Preferably, in the case of an evaporator of the customary size already mentioned, the elliptic rounding of the underside of the flash TV evaporator begins on the side wall after about 1 to 3 mm measured from the upper edge of the flash TV evaporator.

Particularly preferably, the elliptic rounding of the underside of the flash TV evaporator begins on the side wall in the region of the cavity not over the entire width of the cavity but the same distance from the upper edge of the flash TV evaporator.

Particularly preferably, the elliptic rounding of the underside of the flash TV evaporator begins on the side wall in the region of the ends of the cavity at a smaller distance from the upper edge of the flash TV evaporator than in the region of the center of the cavity. The form of the elliptic rounding preferably remains unchanged in this case.

Particularly preferably, the transition of the beginning of the elliptic rounding from the end of the cavity to the center of the cavity is continuous.

The effect of the preferred rounding described is that the cross-sectional area of the flash TV evaporator changes along its longitudinal axis, without taking account of the loss of area caused by the cavity.

In the particularly preferred embodiment, the flash TV evaporator additionally has a change in the cross-sectional area along its longitudinal axis in such a way that the cross-sectional area is smaller in the region of the ends of the cavity than in the center of the cavity, without taking account of the loss of area caused by the cavity. This is illustrated diagrammatically in FIGS. 6(A) to 6(E).

In the flash TV evaporator according to the invention, the flashes with the aluminum pellets come very uniformly, i.e. always at the same time after the beginning of the heating cycle. Moreover, the flash time (the time from the beginning of the melting of the pellets until complete evaporation of the pellets) is shorter than in known flash TV evaporators. The aluminum diverges more rapidly on flowing in the cavity, which is likewise advantageous.

In particular, a flash TV evaporator in which the cross-sectional area is smaller in the region of the ends of the cavity than in the center of the cavity has a very long service life, since, by virtue of this shaping, the thermal loading on the flash TV evaporator in the center of the cavity is minimized and decomposition (change) of the material does not take place until later than in the case of known flash TV evaporators.

The effect of the enlargement according to the invention of the cross section of the flash TV evaporator in the region of the center of the cavity is to reduce the maximum current densities and to permit a larger number of heating cycles.

At the same time, the shape according to the invention also makes use of the advantages of the V-shaped cavity disclosed in DE 19735814. Thus, by virtue of the V-cavity, the cylindrical Al pellet is positioned accurately in the longitudinal axis of the cavity of the flash TV evaporator, which leads to more homogenous spreading of the Al vapor cloud irrespective of the number of heating cycles. Moreover, the lower edge of the cavity acts as a capillary, which leads to improved wetting of the flash TV evaporator by the Al.

The flash TV evaporator, according to the invention, can be produced from ceramic powders containing $TiB_2$, BN and optionally AlN which are customary for evaporators.

It can be operated in customary evaporator systems without it being necessary to make modifications to these systems.

FIGS. 1(A) to (D) shows a standard flash TV evaporator in a clamping system in plan view (A), side view (B) and rectangular cavity cross section (C) and triangular cavity cross section (D).

FIG. 2 shows a flash TV evaporator (1) according to the invention, the cavity (6) which has a triangular shape with straight walls in cross section through the flash TV evaporator and the underside of which is elliptically rounded (7) in the region of the cavity. The elliptic rounding of the underside of the flash TV evaporator does not begin directly on the upper edge of the evaporator but rather on the side wall after about 2 mm measured from the upper edge of the flash TV evaporator.

Figure 3:
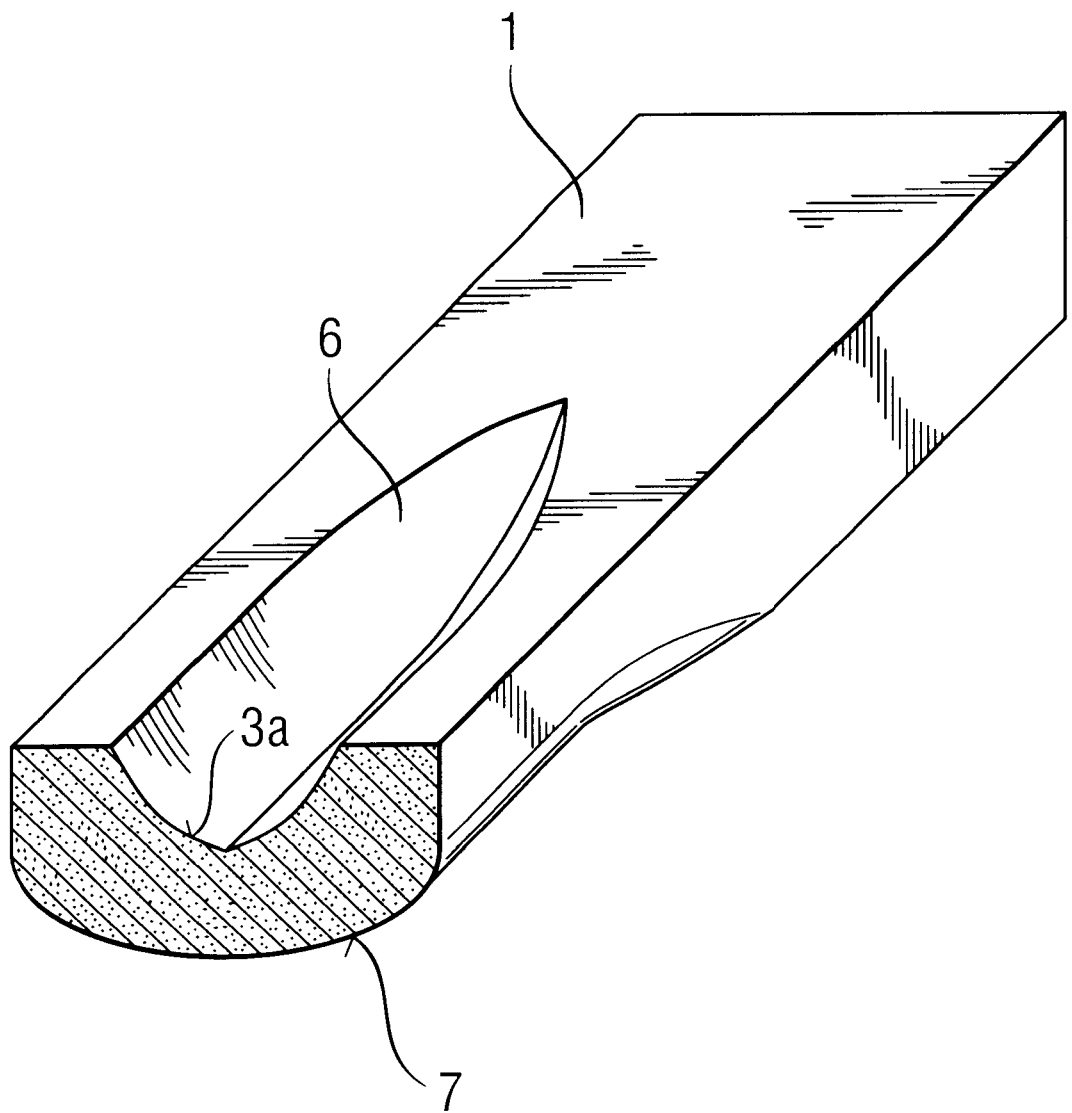
FIG. 3 is a flash TV evaporator of the invention with a cavity having triangular shape with convexly curved walls and an elliptically rounded underside.

FIG. 3 shows a flash TV evaporator (1), according to the invention, the cavity (6) which has a triangular shape with convexly curved walls (3a) in cross section through the flash TV evaporator and the underside of which is elliptically rounded in the region of the cavity as described for FIG. 2.

Figure 4:
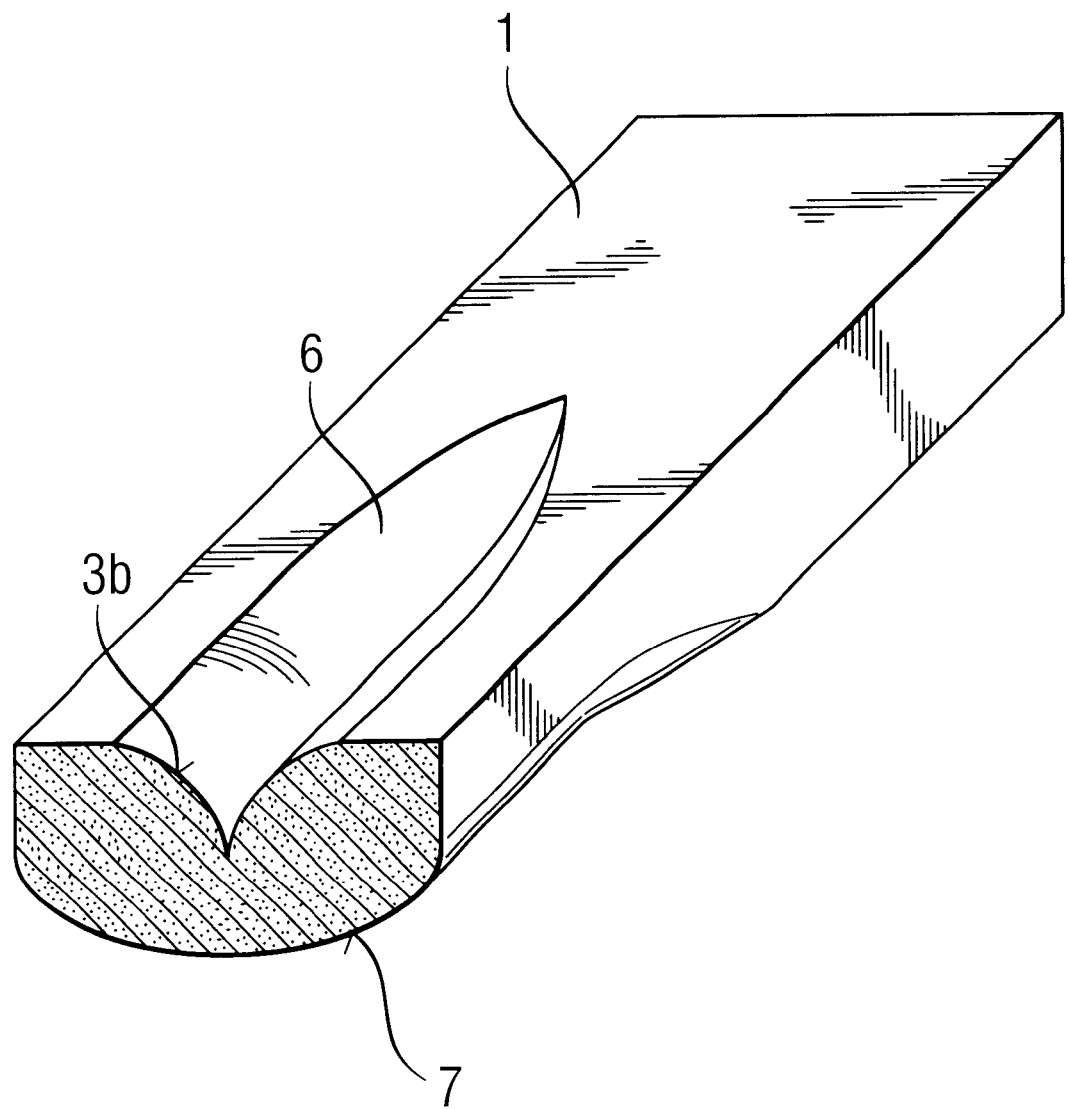
FIG. 4 is an isometric view of a flash TV evaporator of the invention having a triangular cavity with concavely curved walls and an elliptically rounded underside.

FIG. 4 shows a flash TV evaporator (1), according to the invention, the cavity (6) which has a triangular shape with concavely curved walls (3b) in cross section through the flash TV evaporator and the underside of which is elliptically rounded in the region of the cavity as described for FIG. 2.

Figure 5:
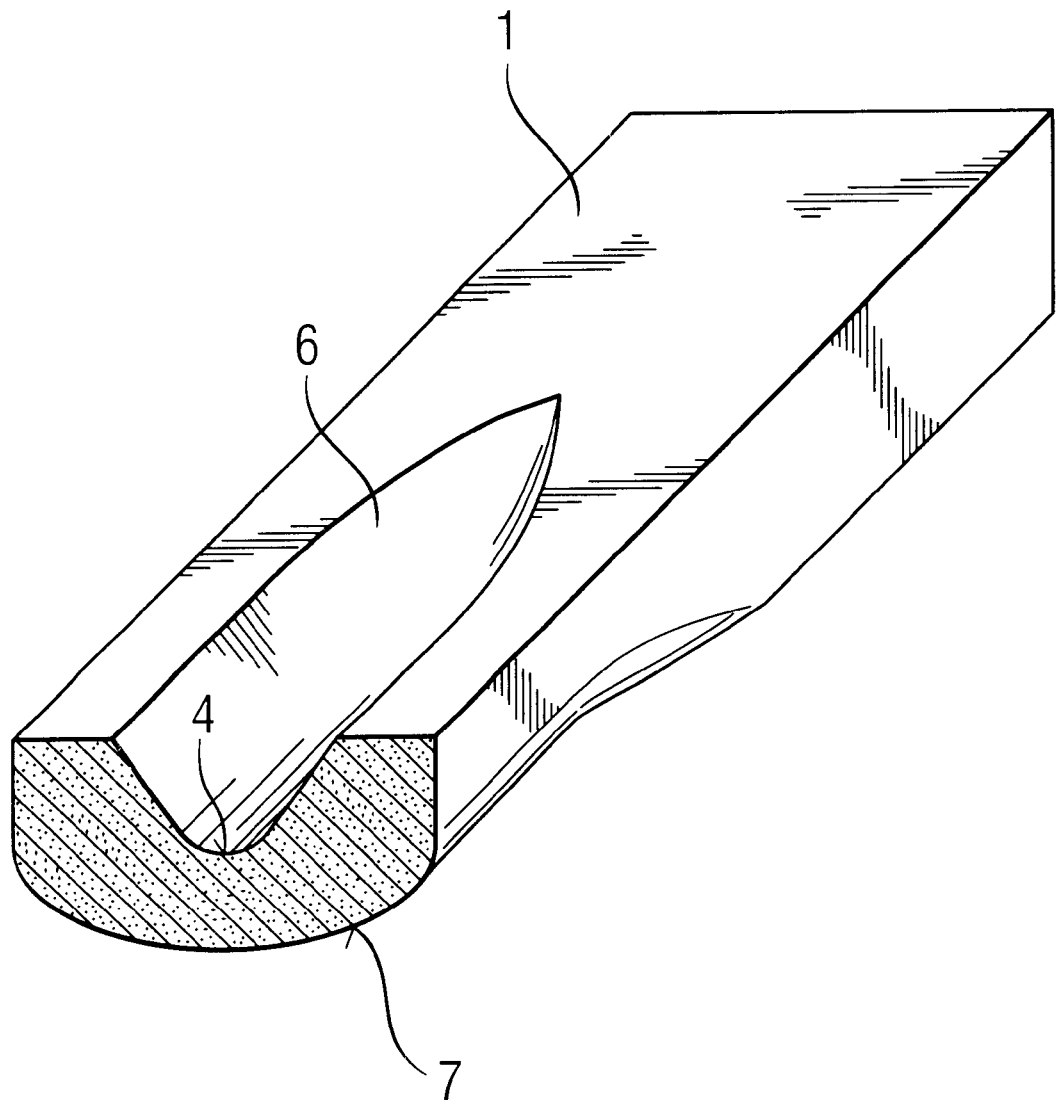
FIG. 5 is an isometric view of a flash TV evaporator of the invention in which the lowest point of the cavity is designed in the form of a radius and the underside of the TV evaporator is elliptically rounded.
Figure 6A:
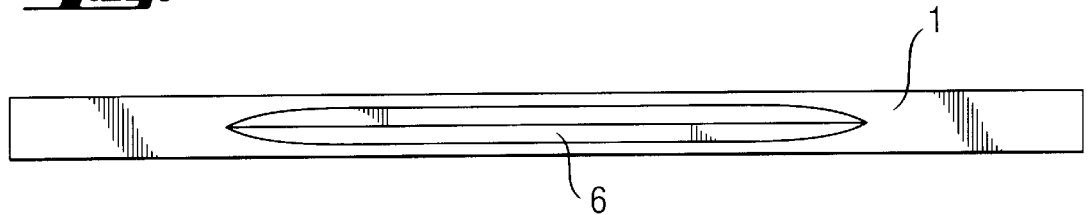
FIGS. 6(A) to (E) show a plan view, a side view and three cross-sectional views of a preferred embodiment of the flash TV evaporator of the invention in which the cross-section is reduced in the region of the ends of the cavity.
Figure 6B:
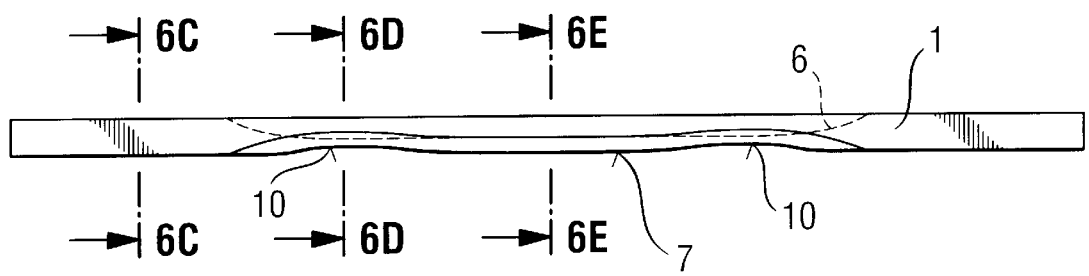
Figure 6C:
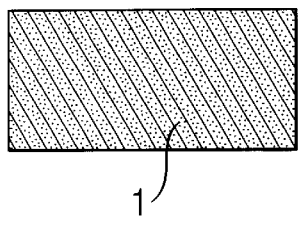
Figure 6D:
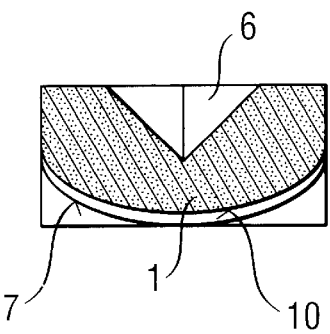
Figure 6E:
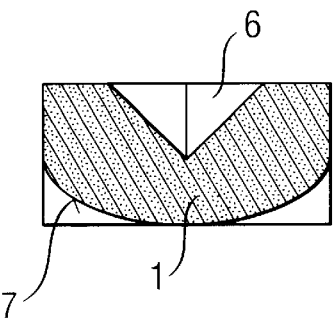

FIG. 5 shows a flash TV evaporator (1) according to the invention, in which the lowest point of the cavity (6) is designed in the form of a radius (4) and the underside of which is elliptically rounded in the region of the cavity, as described for FIG. 2.

FIGS. 6(A) to (E) show in a plan view, a side view and three cross-sectional views, a particularly preferred embodiment of a flash TV evaporator according to the invention, in which the cross section is reduced in the region (O) of the ends of the cavity (6).

Figure 7:
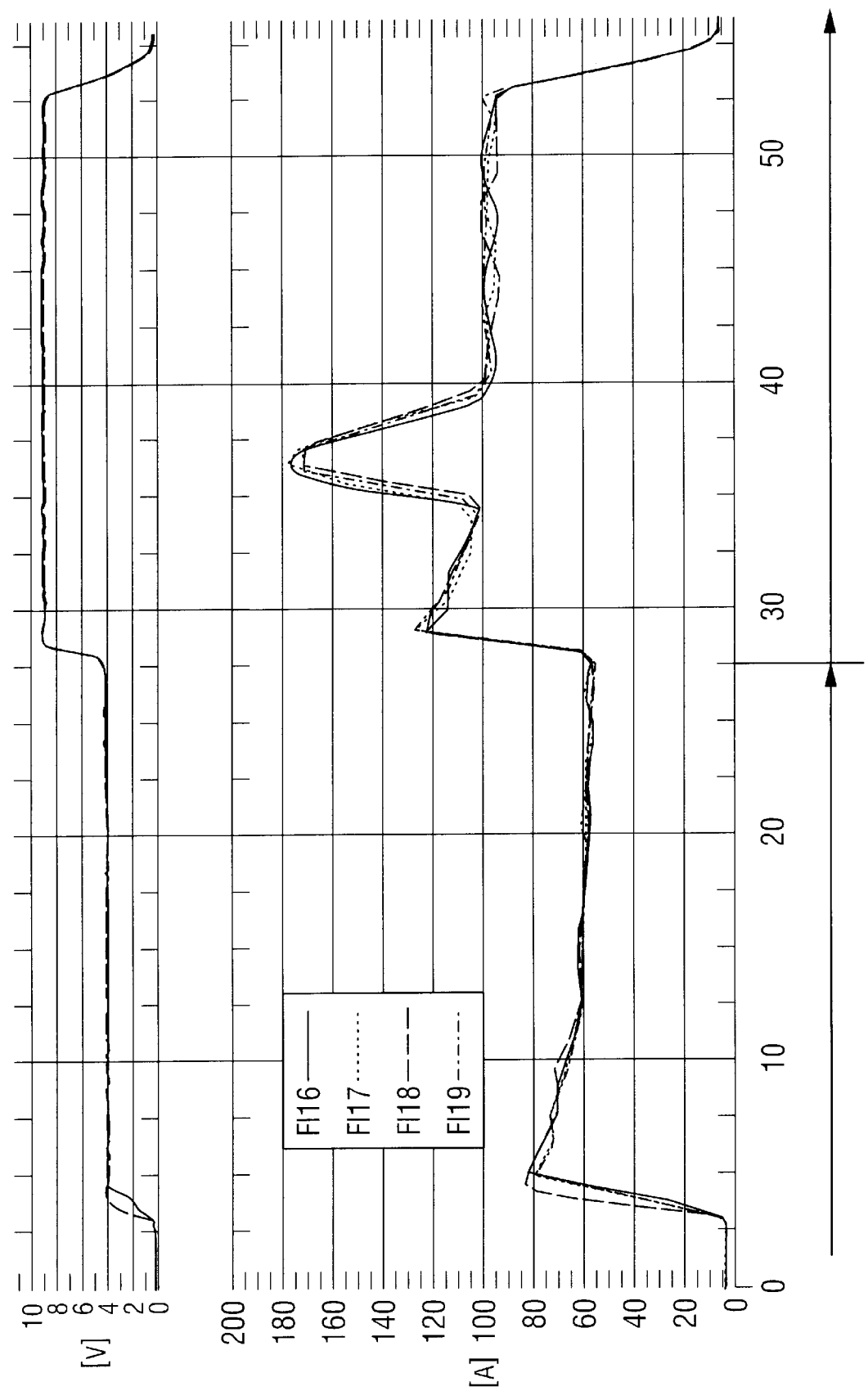
FIG. 7 is a graph showing the voltage and average characteristics of the TV evaporator of the invention.

FIG. 7 shows 4 flashes of the TV evaporator according to the invention (flash 16–19) from the example. The upper curve shows the voltage profile and the lower curve shows the current profile. (Distance between the continuous column graduation lines 10 sec, and between the short column graduation lines at the upper/lower edge 2.5 sec; distance between the row graduation lines 20 amperes).

FIG. 8 shows 4 flashes of the standard TV evaporator (V2) (Flash 16–19), from the example. The upper curve shows the voltage profile and the lower curve shows the current profile. (The distance between the continuous column graduation lines 10 sec, and between the short column graduation lines at the upper/lower edge 2.5 sec; distance between the row graduation lines 20 amperes).

Figure 9A:
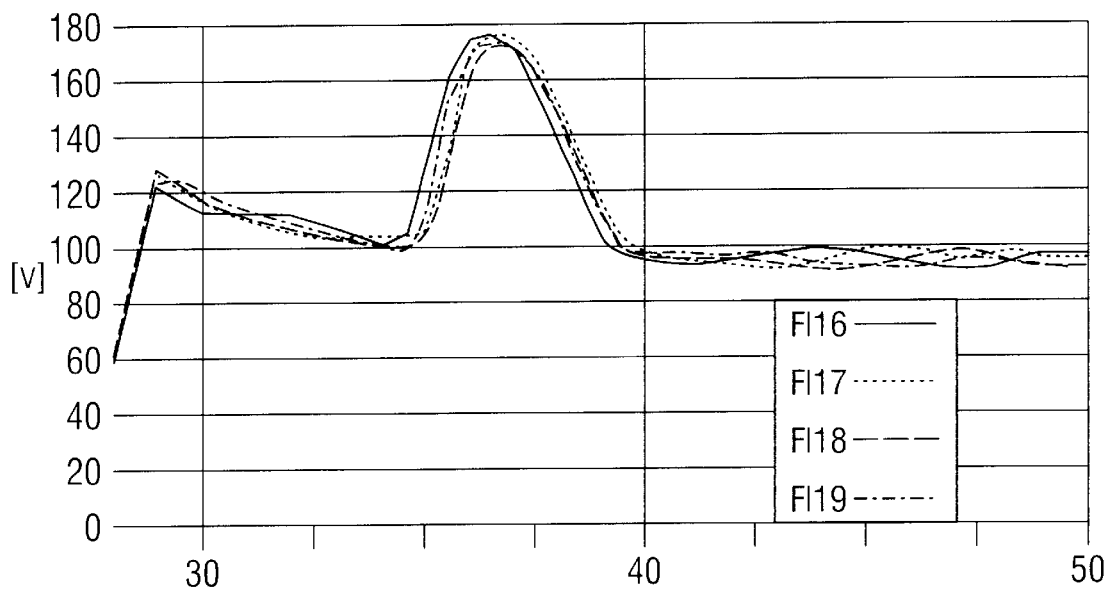
FIGS. 9(A) to (B) show in enlarged detail the current profile of FIG. 7 and FIG. 8.
Figure 9B:
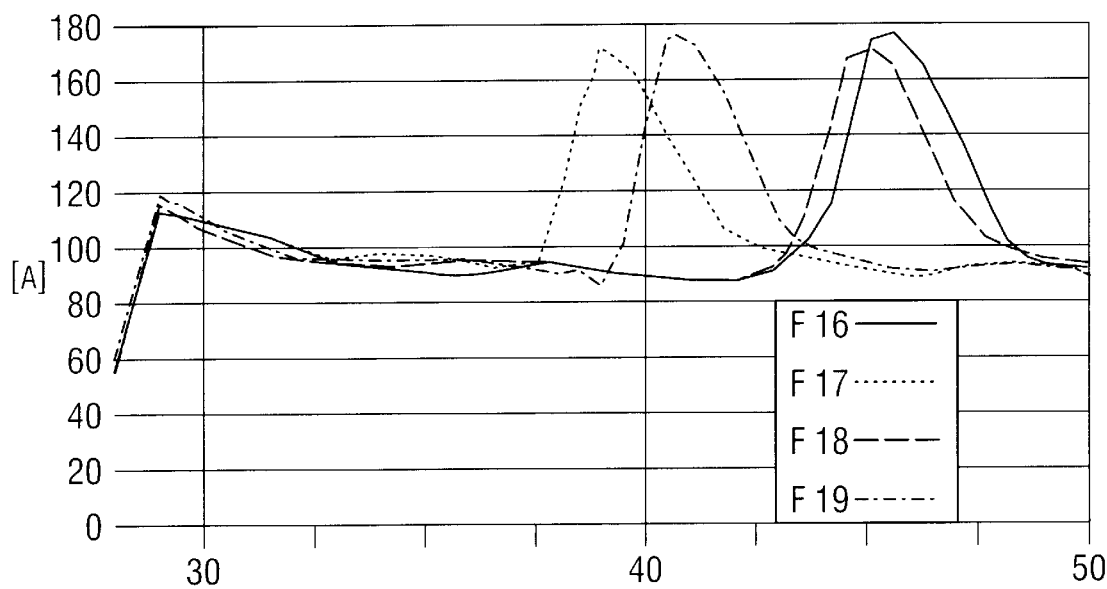

FIGS. 9(A) and (B) show an enlarged detail of the current profile from FIG. 7 and FIG. 8. For comparison between one another, the 4 flashes both from FIG. 7 and from FIG. 8 are reproduced from the beginning of "evaporation". (The distance between the continuous column graduation lines 10 sec, and between the short column graduation lines in the center and at the lower edge 2.5 sec; distance between the row graduation lines 20 amperes).

The following example will serve to explain the invention further:

EXAMPLE

An elliptic flash TV evaporator (V1) according to the invention and a customary flash TV evaporator (V2) made of a customary ceramic material for flash TV evaporators were operated in an evaporator clamping system.

Evaporator according to the invention (V1): Overall dimensions: 4.6.110 mm; triangular cavity in the cross section of the flash TV evaporator with straight walls (largest depth.width.length: 2.4.60 mm). Elliptic underside of the evaporator over the entire length of the cavity; beginning of the elliptic rounding in the region of the ends of the evaporator (25 mm from the ends of the evaporator) at least 1.5 mm below the upper edge of the evaporator; in the center of the cavity 2.0 mm below the upper edge of the evaporator; transition see FIG. 6. Tapered elliptic underside of the evaporator at both ends of the cavity over a length of 15 mm. Tapering 0.5 mm. The width to which it is clamped laterally at each end is about 15 mm. The length of the flash TV evaporator to be heated in 80 mm.

Standard TV evaporator (comparative evaporator V2): overall dimensions same as (V1). Triangular cavity in the cross section of the flash TV evaporator (2.4.60 mm). The width to which it is clamped laterally corresponds to V1. The length of the flash TV evaporator to be heated corresponds to V1. The material corresponds to V1.

Test conditions:

| (Al pellet mass = 85 mg)/Vacuum: | $<1.10^{-4}$ bar |
|---|---|
| V1: Preheating: 4.0 V/25 sec | Evaporation: 9.0 V/25 sec |
| V2: Preheating: 4.5 V/25 sec | Evaporation: 9.5 V/25 sec |

Since at least 10 flashes have to be carried out in order to "run in" the TV evaporators, the flashes 16–19 are reproduced in each case in FIGS. 7 and 8. The upper curve shows the voltage profile and the lower curve shows the current profile.

FIG. 7 shows the 4 flashes (abbreviated to F116, F117, F118 and F119) of the TV evaporator according to the invention (V1). FIG. 8 shows the 4 flashes (abbreviated to F16, F17, F18 and F19) of the standard TV evaporator (V2). For improved clarity FIG. 9(A), (B) reproduces an enlarged detail from FIG. 7 and FIG. 8.

The flash is manifested as a high current peak in the figures. The current peak is produced by the melting and divergent flowing of the pellet (rising slope). The Al then evaporates (falling slope) until the TV evaporator is "dry" again.

The flash time of the elliptic TV evaporator (V1) according to the invention is about 5 s, and that of the standard TV evaporator (V2) is about 7 s.

The falling slope is longer in the case of V2 than in the case of V1. This means that the Al remains in the cavity for longer in the case of V2 than in the case of V1.

Wetting and evaporation take place at lower voltages in the case of V1 than in the case of V2. (V1: 4.0V/9.0V; V2: 4.5V/9.5V). This means that the current density in V1 and thus also the loading on the material are lower than in V2.

Moreover, the flashes come about 3 s sooner in the case of V1 than in the case of V2. In addition, they come very much more uniformly in the case of V1 than in the case of V2. This means that the wetting is better in the case of V1, and the temperature rises more rapidly in the region of the cavity.

The greater uniformity of the flashes in the case of V1 also leads to a reduction in the burden on the material of V1. Since the flashes come so early, work could even be carried out with still lower voltages and thus with still lower current densities in an evaporation coating system, which in turn reduces the material loading further and extends the service life of the evaporator further.

We claim:

1. A ceramic flash TV evaporator for the evaporation coating of picture tubes with aluminum, containing a cavity having a triangular cross section and whose width tapers in cross section through the evaporator from an upper edge of the evaporator to a lower edge of the evaporator, wherein two side faces of the triangular cavity have a shape selected from the group consisting of straight, curved convexly, concavely and a combination thereof, wherein the transition of the side walls of the evaporator to the underside of the evaporator is elliptically rounded in cross section at least over part of the longitudinal axis of the evaporator, so that the evaporator is in the form of a divided ellipse in cross section on the underside in the region of the cavity, and a rectangular shape in cross section at ends of the evaporator, wherein the elliptic rounding does not begin directly at the upper edge of the evaporator and begins on the side wall in the region of the ends of the cavity at a smaller distance from the upper edge of the flash TV evaporator than in the region of the center of the cavity.

2. The ceramic flash TV evaporator as claimed in claim 1, wherein the lowest point of the cavity comprises a radius.

3. The ceramic flash TV evaporator as claimed in claim 1, wherein the elliptic rounding of the underside of the flash TV evaporator begins on the side wall after about 1 to 3 mm measured from an upper edge of the flash TV evaporator.

4. The ceramic flash TV evaporator as claimed in claim 1, wherein the elliptic rounding of the underside of the flash TV evaporator begins on the side wall in the region of the cavity not over the entire length of the cavity but at a same distance from an upper edge of the flash TV evaporator.

5. The ceramic flash TV evaporator as claimed in claim 1, wherein the form of the elliptic rounding remains unchanged and the transition of the beginning of the elliptic rounding from the end of the cavity to the center of the cavity runs continuously.

* * * * *